(12) United States Patent
Garner et al.

(10) Patent No.: US 10,636,988 B2
(45) Date of Patent: *Apr. 28, 2020

(54) MECHANICALLY FLEXIBLE AND DURABLE SUBSTRATES AND METHOD OF MAKING

(71) Applicant: CORNING INCORPORATED, Corning, NY (US)

(72) Inventors: Sean Matthew Garner, Elmira, NY (US); Gregory Scott Glaesemann, Corning, NY (US); James Joseph Price, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/405,224

(22) Filed: May 7, 2019

(65) Prior Publication Data

US 2019/0259969 A1 Aug. 22, 2019

Related U.S. Application Data

(62) Division of application No. 15/840,888, filed on Dec. 13, 2017, now Pat. No. 10,312,462, which is a
(Continued)

(51) Int. Cl.
*B32B 7/02* (2019.01)
*H01L 51/00* (2006.01)
(Continued)

(52) U.S. Cl.
CPC ............ *H01L 51/0097* (2013.01); *C03C 4/00* (2013.01); *C03C 17/34* (2013.01);
(Continued)

(58) Field of Classification Search
CPC ... C03C 17/34; C03C 4/00; H01L 2251/5338; H01L 31/03926; H01L 51/0097; Y02E 10/549; B32B 7/02
See application file for complete search history.

(56) References Cited

U.S. PATENT DOCUMENTS 2,457,785 A 12/1948 Slayter et al.
3,089,801 A 5/1963 Tierney et al.
(Continued)

FOREIGN PATENT DOCUMENTS

DE 10138772 A1 3/2002
EP 499950 A2 8/1992
(Continued)

OTHER PUBLICATIONS

Antis et al; "A Critical Evaluation of Indentation Techniques for Measuring Fracture Toughness: I, Direct Crack Measurements"; Journal of the American Ceramic Society; vol. 64, No. 9; pp. 533-538.
(Continued)

*Primary Examiner* — Lawrence D Ferguson
(74) *Attorney, Agent, or Firm* — Jeffrey A. Schmidt

(57) ABSTRACT

A flexible substrate are disclosed comprising an amorphous inorganic composition, wherein the substrate has a thickness of less than about 250 μm and has at least one of: a) a brittleness ratio less than about 9.5 $(\mu m)^{-1/2}$, or b) a fracture toughness of at least about 0.75 $MPa \cdot (m)^{1/2}$. Electronic devices comprising such flexible devices are also disclosed. Also disclosed is a method for making a flexible substrate comprising selecting an amorphous inorganic material capable of forming a substrate having a thickness of less than about 250 μm and having at least one of: a) a brittleness ratio of less than about 9.5 $(\mu m)^{-1/2}$, or b) a fracture toughness of at least about 0.75 $MPa \cdot (m)^{1/2}$; and then forming a substrate from the selected inorganic material.

20 Claims, 2 Drawing Sheets

Related U.S. Application Data division of application No. 15/232,401, filed on Aug. 9, 2016, now Pat. No. 10,276,811, which is a division of application No. 11/804,865, filed on May 21, 2007, now Pat. No. 9,434,642.

(51) Int. Cl.
*H01L 31/0392* (2006.01)
*C03C 4/00* (2006.01)
*C03C 17/34* (2006.01)

(52) U.S. Cl.
CPC .......... *H01L 31/03926* (2013.01); *H01L 2251/5338* (2013.01); *Y02E 10/549* (2013.01)

(56) References Cited

U.S. PATENT DOCUMENTS

| | | | |
|---|---|---|---|
| 3,186,813 | A | 6/1965 | Pfaender |
| 3,247,428 | A | 4/1966 | Perri et al. |
| 3,391,053 | A | 7/1968 | Kolb |
| 3,574,030 | A | 4/1971 | Callander et al. |
| 4,388,368 | A | 6/1983 | Hibino et al. |
| 4,881,410 | A | 11/1989 | Wise et al. |
| 4,888,061 | A | 12/1989 | Wenz |
| 5,445,890 | A | 8/1995 | Bayha et al. |
| 5,479,070 | A | 12/1995 | Murakami |
| 5,665,454 | A | 9/1997 | Hosoi et al. |
| 5,824,127 | A | 10/1998 | Bange et al. |
| 5,888,643 | A | 3/1999 | Aylward et al. |
| 6,089,801 | A | 7/2000 | Hardesty |
| 6,281,525 | B1 | 8/2001 | Krijn et al. |
| 6,287,674 | B1 | 9/2001 | Verlinden et al. |
| 6,309,901 | B1 | 10/2001 | Tahon et al. |
| 6,340,812 | B1 | 1/2002 | Izumi et al. |
| 6,592,969 | B1 | 7/2003 | Burroughes et al. |
| 6,815,070 | B1 | 11/2004 | Burkle et al. |
| 6,849,861 | B2 | 2/2005 | Iwashita et al. |
| 6,880,405 | B2 | 4/2005 | Mouhebaty et al. |
| 6,881,692 | B2 | 4/2005 | Murata et al. |
| 7,037,306 | B2 | 5/2006 | Podany et al. |
| 7,105,252 | B2 | 9/2006 | Kelley et al. |
| 7,670,976 | B2 | 3/2010 | Lee et al. |
| 7,691,730 | B2 | 4/2010 | Gadkaree et al. |
| 7,851,394 | B2 | 12/2010 | Ellison |
| 9,434,642 | B2 | 9/2016 | Garner et al. |
| 2002/0160153 | A1* | 10/2002 | Minami .......... B29C 39/10 428/156 |
| 2003/0124341 | A1 | 7/2003 | Burroughes et al. |
| 2004/0004605 | A1 | 1/2004 | David |
| 2004/0038339 | A1 | 2/2004 | Kufer et al. |
| 2004/0142118 | A1 | 7/2004 | Takechi |
| 2004/0189191 | A1 | 9/2004 | Ohshita et al. |
| 2004/0197575 | A1 | 10/2004 | Bocko et al. |
| 2004/0262612 | A1 | 12/2004 | Vidal et al. |
| 2005/0003295 | A1 | 1/2005 | Koninckx et al. |
| 2005/0096208 | A1 | 5/2005 | Zachau et al. |
| 2005/0136625 | A1 | 6/2005 | Henseler et al. |
| 2005/0236985 | A1 | 10/2005 | Handa et al. |
| 2005/0259189 | A1 | 11/2005 | Bouten et al. |
| 2006/0182996 | A1 | 8/2006 | Nakamura et al. |
| 2007/0037306 | A1 | 2/2007 | Chen |
| 2007/0105252 | A1 | 5/2007 | Lee et al. |

FOREIGN PATENT DOCUMENTS

| | | |
|---|---|---|
| EP | 535861 A2 | 4/1993 |
| EP | 716339 A1 | 6/1996 |
| EP | 808722 A1 | 11/1997 |
| EP | 949850 A1 | 10/1999 |
| GB | 1319846 A | 6/1973 |
| JP | 2000500108 A | 1/2000 |
| JP | 2001318219 A | 11/2001 |
| JP | 2004500108 A | 1/2004 |
| JP | 2005019082 A | 1/2005 |
| JP | 2005096108 A | 4/2005 |
| JP | 2006131482 A | 5/2006 |
| JP | 4231342 B2 | 2/2009 |
| KR | 1020050042095 A | 5/2005 |
| KR | 1020060110388 A | 10/2006 |
| KR | 102006134400 A | 12/2006 |
| TW | 239238 B | 1/1995 |
| TW | 200704613 A | 2/2007 |
| WO | 1998020389 A1 | 5/1998 |
| WO | 2004036298 A1 | 4/2004 |
| WO | 2007029844 A1 | 3/2007 |

OTHER PUBLICATIONS

Anderson; "Fracture Mechanics, Fundamentals and Applications"; Second Edition, CRC Press LLC, 1995, pp. 84 405-421.
Auch et al; "Ultrathin Glass for Flexible OLED Application"; Thin Solid Films; 417 (2002) 47-50.
Freiman et al. "A Computerized Fracture Mechanics Database for Oxide Glasses" NBS Technical Note 1212. US Department of Commerce National Bureau of Standards. Issued Jun. 1985. 96 pgs.
Lawn et al; "Hardness, Toughness, and Brittleness: An Indentation Analysis"; Journal of The American Ceramic Society, vol. 62, No. 7-8; pp. 347-350.
International Search Report of the International Searching Authority; PCT/US2008/006329 dated Oct. 15, 2008; 4 Pages.
Lambropoulos et al. "Surface microroughness of optical glasses under deterministic microgrinding" Applied Optics 35(22) 1996, pp. 4448-4462.
Wachtman et al; "Mechanical Properties of Ceramics"; Linear Elastic Fracture Mechanics; 23 Pages.
Richerson; "Modern Ceramic Engineering, Properties, Processing and Use in Design"; 18 Pages.
Oliver et al; "An Improved Technique for Determining Hardness and Elastic Modulus Using Load and Displacement Sensing Indentation Experiments"; J. Mater. Res., vol. 7, No. 6 Jun. 1992; pp. 1564-1583.
Schott: Glass Made of Ideas. "TIE-33: Design strength of optical glass and ZERODUR". Oct. 2004, 10 pgs.
Sehgal et al. "A New Low-Brittleness Glass in the Soda-Lime-Silica Glass Family", J. Am. Ceram. Soc. 81 (9) 2485-2488 (1998.
Sehgal et al; "Brittleness of Glass"; Journal of Non-Crystalline Solids; 253 (1999) 126-132.
CN20080023240.6 Office Action dated May 18, 2011.
EP08754520.8 Office Action dated Feb. 14, 2011.
HPFS Fused Silica ArF Grade 7980.
HPFS Fused Silica KrF Grade 7980.
HPFS Fused Silica Standard Grade 7980.
JP2010509350 Office Action dated May 22, 2012.
KR1020097026205 Office Action dated Nov. 13, 2013.
Material Information 1737 G 1998 Props.
Properties of Pyrex, Pyrexplus and Low Actinic Pyrex Code 7740 Glasses; 3 Pages.
TW097118440 Office Action dated Sep. 17, 2015.
TW097118440 Search Report dated Mar. 12, 2012.
EP08754520.8 Office Action dated Apr. 21, 2016, European Patent Office.

\* cited by examiner

MECHANICALLY FLEXIBLE AND DURABLE SUBSTRATES AND METHOD OF MAKING

CROSS-REFERENCE TO RELATED APPLICATIONS

This application is a divisional application and claims the benefit of priority under 35 U.S.C. § 120 of U.S. application Ser. No. 15/840,888, filed on Dec. 13, 2017, which in turn, is a divisional application and claims the benefit of priority under 35 U.S.C. § 120 of U.S. application Ser. No. 15/232, 401, filed on Aug. 9, 2016, which in turn, is a divisional and claims the benefit of priority under 35 U.S.C. § 120 of U.S. Pat. No. 9,434,642, granted on Sep. 6, 2016, the contents of each of which are relied upon and incorporated herein by reference in their entireties.

BACKGROUND OF THE INVENTION

Field of the Invention

The present invention relates to flexible substrates and methods used in the manufacture of flexible substrates.

Technical Background

Flexible substrates can be used in a variety of applications including electronic devices, such as, for example, light emitting displays. In such applications, flexible substrates can be subjected to tensile, compressive, and shear stresses during manufacture, handling, and operation that can result in device failure or a reduction in the lifetime of a device. The mechanical requirements and thus, the selection and/or manufacture of appropriate substrate materials, can vary depending on the intended application. Several factors typically considered in evaluating substrate materials include: mechanical durability, process compatibility, weight, bend radius, thermal capability, surface roughness, transparency, electrical properties, and cost.

Various materials have been used in the manufacture of flexible substrates and devices. Metal substrates, such as, for example, stainless steels, typically exhibit properties, such as, for example, surface roughness, non-transparency, and conductivity, that are incompatible with at least some light emitting display devices. Similarly, thermoplastic substrates, such as, for example, polyethylene naphthalate, polyethersulfone, polycarbonate, and polyimide, can exhibit oxygen and water barrier properties, coefficients of thermal expansion, thermo-mechanical stability, thermal limitations, and chemical durability properties that are incompatible with at least some light emitting display devices. While inorganic film coatings can be employed to alter the barrier properties of thermoplastic substrates, these thin films are typically brittle and are prone to cracking, thus resulting in permeability and/or device failure.

Substrates comprised of glass materials have traditionally been selected based on available materials and extrinsic properties such as, for example, thickness. The glass materials typically selected can exhibit poor mechanical stability as a result of brittleness and/or poor mechanical durability that are not sufficient to withstand the device manufacturing process and/or use in the final application.

The size and durability requirements for electronic devices are continuously increasing. Thus, there is a need to address dimensional stability, coefficients of thermal expansion, toughness, transparency, thermal capability, barrier and hermetic properties, and other properties of flexible substrates related to use in electronic devices. These needs and other needs are satisfied by the composition and methods of the present invention.

SUMMARY OF THE INVENTION

The present invention relates to flexible substrates and specifically to mechanically durable flexible substrates comprising an amorphous inorganic composition that can be used in, for example, electronic devices, such as light emitting displays. The present invention addresses at least a portion of the problems described above through the use of novel compositions, selection criteria, and/or methods of manufacture.

In a first aspect, the present invention provides a substrate comprising an amorphous inorganic composition, wherein the substrate has a thickness of less than about 250 μm and at least one of: a) a brittleness ratio of less than about 9.5 $(\mu m)^{-1/2}$, or a fracture toughness of at least about 0.75 $MPa \cdot (m)^{1/2}$.

In a second aspect, the present invention provides an electronic device comprising a flexible substrate comprising an amorphous inorganic composition, wherein the substrate has a thickness of less than about 250 μm and at least one of: a) a brittleness ratio of less than about 9.5 $(\mu m)^{-1/2}$, or a fracture toughness of at least about 0.75 $MPa \cdot (m)^{1/2}$.

In a third aspect, the present invention provides a method for making a flexible substrate comprising: a) selecting an amorphous inorganic material capable of forming a substrate having a thickness of less than about 250 μm and having at least one of: i) a brittleness ratio of less than about 9.5 $(\mu m)^{-1/2}$, or ii) a fracture toughness of at least about 0.75 $MPa \cdot (m)^{1/2}$; and b) forming a substrate from the inorganic material selected in a).

In a fourth aspect, the present invention provides a flexible substrate made by the method described herein.

Additional aspects and advantages of the invention will be set forth, in part, in the detailed description, figures, and any claims which follow, and in part will be derived from the detailed description or can be learned by practice of the invention. The advantages described below will be realized and attained by means of the elements and combinations particularly pointed out in the appended claims. It is to be understood that both the foregoing general description and the following detailed description are exemplary and explanatory only and are not restrictive of the invention as disclosed.

BRIEF DESCRIPTION OF THE DRAWINGS

The accompanying drawings, which are incorporated in and constitute a part of this specification, illustrate certain aspects of the present invention and together with the description, serve to explain, without limitation, the principles of the invention. Like numbers represent the same elements throughout the figures.

DETAILED DESCRIPTION OF THE INVENTION

Figure 1:
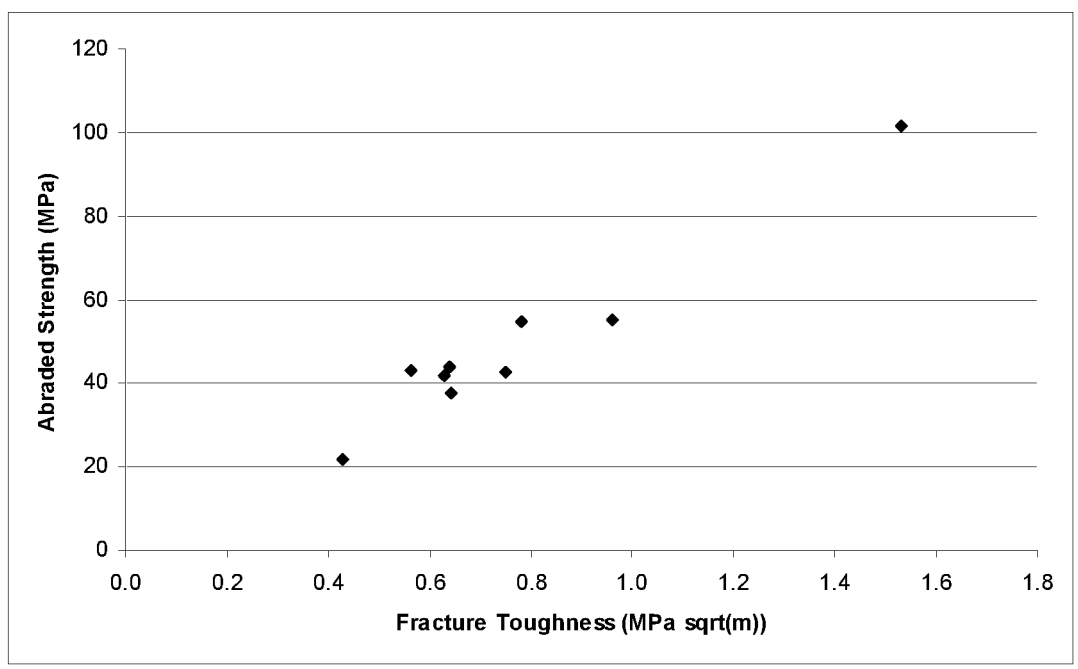
FIG. 1 illustrates the abraded strength of various materials as a function of fracture toughness, in accordance with various aspects of the present invention.

The present invention can be understood more readily by reference to the following detailed description, drawings, examples, and claims, and their previous and following description. However, before the present compositions, articles, devices, and methods are disclosed and described, it is to be understood that this invention is not limited to the specific compositions, articles, devices, and methods disclosed unless otherwise specified, as such can, of course, vary. It is also to be understood that the terminology used herein is for the purpose of describing particular aspects only and is not intended to be limiting.

The following description of the invention is provided as an enabling teaching of the invention in its currently known aspects. To this end, those skilled in the relevant art will recognize and appreciate that many changes can be made to the various aspects of the invention described herein, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptations to the present invention are possible and can even be desirable in certain circumstances and are a part of the present invention. Thus, the following description is provided as illustrative of the principles of the present invention and not in limitation thereof.

Disclosed are materials, compounds, compositions, and components that can be used for, can be used in conjunction with, can be used in preparation for, or are products of the disclosed method and compositions. These and other materials are disclosed herein, and it is understood that when combinations, subsets, interactions, groups, etc. of these materials are disclosed that while specific reference of each various individual and collective combinations and permutation of these compounds may not be explicitly disclosed, each is specifically contemplated and described herein. Thus, if a class of substituents A, B, and C are disclosed as well as a class of substituents D, E, and F and an example of a combination aspect, A-D is disclosed, then each is individually and collectively contemplated. Thus, in this example, each of the combinations A-E, A-F, B-D, B-E, B-F, C-D, C-E, and C-F are specifically contemplated and should be considered disclosed from disclosure of A, B, and C; D, E, and F; and the example combination A-D. Likewise, any subset or combination of these is also specifically contemplated and disclosed. Thus, for example, the sub-group of A-E, B-F, and C-E are specifically contemplated and should be considered disclosed from disclosure of A, B, and C; D, E, and F; and the example combination A-D. This concept applies to all aspects of this disclosure including, but not limited to any components of the compositions and steps in methods of making and using the disclosed compositions. Thus, if there are a variety of additional steps that can be performed it is understood that each of these additional steps can be performed with any specific aspect or combination of aspects of the disclosed methods, and that each such combination is specifically contemplated and should be considered disclosed.

In this specification and in the claims which follow, reference will be made to a number of terms which shall be defined to have the following meanings:

As used herein, the singular forms "a," "an" and "the" include plural referents unless the context clearly dictates otherwise. Thus, for example, reference to a "component" includes aspects having two or more such components, unless the context clearly indicates otherwise.

"Optional" or "optionally" means that the subsequently described event or circumstance can or cannot occur, and that the description includes instances where the event or circumstance occurs and instances where it does not. For example, the phrase "optional component" means that the component can or can not be present and that the description includes both aspects of the invention including and excluding the component.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

The following documents describe various compositions and methods for testing physical properties of compositions, and they are hereby incorporated by reference in their entirety and for the specific purpose of disclosing materials and testing methodologies relating to hardness, fracture toughness, and brittleness ratios: Anstis, G. R. et al. "A Critical Evaluation of Indentation Techniques for Measuring Fracture Toughness: I, Direct Crack Measurements", J. Am. Ceram. Soc. 64 (9) 533-538 (1981); Lawn, B. R. et al. "Hardness, Toughness, and Brittleness: An Indentation Analysis", J. Am. Ceram. Soc. 62 (7-8) 347-350 (1979); Sehgal, Jeetendra et al. "A New Low-Brittleness Glass in the Soda-Lime-Silica Glass Family", J. Am. Ceram. Soc. 81 (9) 2485-2488 (1998); Sehgal, Jeetendra et al. "Brittleness of glass", J. Non-Crystalline Solids 253 (1999) 126-132; and Oliver, W. C. et al. "An improved technique for determining hardness and elastic modulus using load and displacement sensing indentation experiments", J. Mater. Res. 7 (6) 1564-1583 (1992).

As briefly introduced above, the present invention provides compositions for flexible substrates and specifically mechanically durable, flexible substrates that comprise an amorphous inorganic composition and can be used in electronic devices, such as, for example, light emitting displays, including LCD, OLED, electrophoretic, and cholesteric liquid crystal based display devices, as well as silicon and organic semiconductor devices, such as photovoltaic, RFID, solar cell, and sensor technology devices. The present invention provides, in part, criteria for selecting substrate materials that can be suitable for use in such electronic devices. The selection criteria and properties described herein can be utilized individually or in any combination that can provide a suitable substrate.

Electronic applications, such as flexible light emitting display devices, can require a substrate to be capable of being bent or of tolerating tensile stresses during, for example, manufacturing and/or use. Failure of substrates is typically dependent upon the size and concentration of substrate flaws, the amount of stress placed on the substrate, and the substrate material's ability to resist fractures. Various approaches have been attempted to reduce or prevent substrate failure. Such approaches include the addition of coating layers to a substrate to prevent defects from forming at the substrate surface and minimizing the stress level experienced by a substrate, such as by, for example, minimizing the modulus of the substrate material, minimizing the substrate thickness, and/or minimizing the distance between the substrate surface and the stress-free neutral axis. The present invention provides selection criteria for substrate materials, such as fracture toughness, brittleness ratio, modulus, fatigue strength, and bend radii. Such selection criteria can address a substrate material's ability to resist fractures or strength limiting damage, as well as other intrinsic material properties.

The substrate of the present invention can be any thickness suitable for use in an electronic device. The substrate can be less than about 250 µm, for example, 250, 220, 180, 150, 110, 80, 75, 60, 40, or 30 µm; preferably less than about 150 µm, for example, 140, 120, 100, 80, 75, 60, or 40 µm; or more preferably less than about 75 µm, for example, 70, 60, 50, 40, or 30 µm. In one aspect, the substrate has a thickness of from about 1 µm to less than about 250 µm. In another aspect, the substrate is about 250 µm. In another aspect, the substrate is about 150 µm thick. In yet another aspect, the substrate is about 75 µm thick. In various other aspects, the substrate can be about 250 µm or greater.

The primary selection criteria for the substrate material of the present invention include fracture toughness and/or brittleness ratio. A substrate of the present invention can have a fracture toughness, a brittleness ratio, or both a fracture toughness and a brittleness ratio in accordance with the descriptions and values described herein.

Fracture Toughness

Fracture toughness, as used herein, refers to the ability of a material containing a crack or other defect to resist fracture. Fracture toughness, denoted as $K_{Ic}$, is typically expressed in units of MPa·(m)$^{1/2}$. Fracture toughness is a quantitative expression of a material's resistance to brittle fracture when a crack is present. The substrate of the present invention can have a fracture toughness of at least about 0.75 MPa·(m)$^{1/2}$, for example, about 0.75, 0.77, 0.80, 0.83, 0.85, 0.87, 0.9, 0.95, 0.99, 1.0, 1.5, or 1.1 MPa·(m)$^{1/2}$; preferably at least about 0.85 MPa·(m)$^{1/2}$, for example, about 0.85, 0.87, 0.9, 0.95, 0.99, 1.0, 1.5, or 1.1 MPa·(m)$^{1/2}$; more preferably at least about 1.0 MPa·(m)$^{1/2}$, for example, about 1.0, 1.05, 1.1, 1.15, or 2 MPa·(m)$^{1/2}$; or most preferably at least about 1.1 MPa·(m)$^{1/2}$, for example, about 1.1, 1.12, 1.14, 1.16, 1.18, 1.2, or 1.3 MPa·(m)$^{1/2}$. In one aspect, the substrate has a fracture toughness of from at least about 0.75 MPa·(m)$^{1/2}$ to about 10 MPa·(m)$^{1/2}$. In another aspect, the substrate of the present invention has a fracture toughness of about 0.86 MPa·(m)$^{1/2}$. In another aspect, the substrate of the present invention has a fracture toughness of about 0.95 MPa·(m)$^{1/2}$.

Brittleness Ratio

Brittleness ratio, as used herein, refers to the ratio of hardness to fracture toughness for a specific material. Brittleness ratio can typically be expressed as $H/K_{Ic}$ and has the units of (µm)$^{-1/2}$. A mechanically durable, flexible substrate will exhibit a low hardness and a high fracture toughness, thus resulting in a low brittleness ratio. A substrate of the present invention can have a brittleness ratio of less than about 9.5 (µm)$^{-1/2}$, for example, less than about 9.5, 9.3, 9.1, 8.8, 8.5, 8.3, 8.1, 7.9, 7.75, 7.5, 7.25, 7.0, 6.75, 6.5, 6.25, 6, or 5.5 (µm)$^{-1/2}$; preferably less than about 8.0 (µm)$^{-1/2}$, for example, less than about 8.0, 7.9, 7.75, 7.5, 7.25, 7.0, 6.75, 6.5, 6.25, 6, or 5.5 (µm)$^{-1/2}$; more preferably less than about 6.5 (µm)$^{-1/2}$, for example, less than about 6.5, 6.25, 6, 5.5, 5. or 4.5 (µm)$^{-1/2}$; or most preferably less than about 5.5 (µm)$^{-1/2}$, for example, less than about 5.5, 5.25, 5, 4.75, or 4.5 (µm)$^{-1/2}$. In one aspect, the substrate has a brittleness ratio of from about 0.1 (µm)$^{-1/2}$ to less than about 9.5 (µm)$^{-1/2}$. In another aspect, the substrate has a brittleness ratio of about 6.46 (µm)$^{-1/2}$. In another aspect, the substrate has a brittleness ratio of about 5.5 (µm)$^{-1/2}$.

The substrate of the present invention can have a fracture toughness and/or a brittleness ratio as described above. It is not necessary that a substrate have both a fracture toughness of, for example, at least about 0.75 MPa·(m)$^{1/2}$, and a brittleness ratio of, for example, less than about 9.5 (µm)$^{-1/2}$. In one aspect, a substrate has a fracture toughness of at least about 0.75 MPa·(m)$^{1/2}$. In another aspect, a substrate has a brittleness ratio of less than about 9.5 (µm)$^{-1/2}$. In yet another aspect, a substrate has both a fracture toughness of at least about 0.75 MPa·(m)$^{1/2}$ and a brittleness ratio of less than about 9.5 (µm)$^{-1/2}$.

Modulus×Substrate Thickness

The stress level that a substrate material experiences during bending can be proportional to the modulus (E) of the substrate material and to the distance from the stress free neutral axis. The location of the stress free neutral axis of a particular substrate can vary with the substrate composition. The location of the stress free neutral axis can also vary between single and multilayer substrates, such as those of a fabricated device or those comprising a coating material. In an exemplary aspect, a flexible substrate is pulled through a roll-to-roll processing system wherein the tensile stress ($\sigma_t$) is inversely proportional to the cross sectional area, and thus to the substrate thickness. In this exemplary aspect, the total stress on the substrate is the sum of the bending stress experienced while traveling through a roller system and the tensile stress described above.

To achieve the desired durability and flexibility, the product of modulus (E) and substrate thickness (t) should be less than about 2 GPa·cm, for example, less than about 2.0, 1.8, 1.6, 1.4, 1.2, 1.0, 0.8, 0.6, or 0.5 GPa·cm; preferably less than about 1.0 GPa·cm, for example, less than about 1.0, 0.9, 0.7, or 0.5 GPa·cm; or more preferably less than about 0.5 GPa·cm, for example, less than about 0.5, 0.4, 0.3, or 0.2. A modulus thickness product less than about 2 GPa·cm is not necessary for the present invention, but can provide improved durability and flexibility to a substrate. In one aspect, a substrate has a product of modulus and thickness of from about 0.001 GPa·cm to less than about 2 GPa·cm. In another aspect, a substrate has a product of modulus and thickness of about 1.8 GPa·cm. In another aspect, a substrate has a product of modulus and thickness of about 1.4 GPa·cm. In yet another aspect, a substrate has a product of modulus and thickness of about 0.5 GPa·cm. The criteria for modulus thickness can be combined with the fracture toughness value, the brittleness ratio, or both the fracture toughness value and the brittleness ratio. In one aspect, a substrate has a modulus thickness product of about 1.8 GPa·cm and a fracture toughness of about 1.0 MPa·(m)$^{1/2}$. In another aspect, a substrate has a modulus thickness product of about 2.5 GPa·cm and a brittleness ratio of less than about 6.5 (µm)$^{-1/2}$. In yet another aspect, a substrate has a modulus thickness product of about 1.8 GPa·cm, a fracture toughness of about 0.9 MPa·(m)$^{1/2}$, and a brittles ratio of less than about 7.0 (µm)$^{-1/2}$. Glass materials that have traditionally been used for flexible substrates, such as, for example, AF45 (Schott), D263 (Shott), and 0211 (Corning), can have low modulus thickness products, but typically do not possess the requisite fracture toughness and/or brittleness ratio.

Fatigue Strength

In flexible substrates, fracture mechanics typically apply to flaws present in the substrate material. In particular, the stress intensity factor, $K_I$, is related to the surface tensile stress, $\sigma_a$, and flaw depth, a, according to the equation $$K_I = Y\sigma_a(\pi a)^{1/2}$$

where Y is a geometric factor for a flaw present in the substrate material. When $K_I$ reaches the fracture toughness of the material ($K_I = K_{IC}$), failure occurs. In addition, the relationship between crack velocity and stress intensity can be represented by the equation $$V = AK_I^n$$

where both A and n are crack growth parameters. The crack growth parameter, n, can provide an indication of the substrate material's susceptibility to subcritical crack growth. For glasses, ceramics, and glass-ceramic materials, n is typically measured using a dynamic fatigue strength where the material strength, $\sigma_f$, is measured as a function of stress rate, $\sigma_r$, such as in the equation $$(\sigma_{f1}/\sigma_{f2})^{n+1} = (\sigma_{r1}/\sigma_{r2})$$

where subscripts 1 and 2 represent the measured strength for differing rates of stress. The value for n can be determined by simple regression of log strength versus log stress rate where the slope is equal to $1/(n+1)$. Exemplary fatigue strength values for glass materials, as obtained by the dynamic fatigue method, are detailed in Table 1, below.

TABLE 1

Exemplary Fatigue Strength Values

| Glass Material | n |
| --- | --- |
| Soda-lime silicate | 15 |
| Alkali free, high lead | 15 |
| Low alkali display glass | 18-29 |
| E glass | 27 |
| Aluminosilicate | 27 |
| $TiO_2$—$SiO_2$ (8 wt. %) | 30 |
| Borosilicate | 33 |
| Silica | 38 |

Glass materials used in conventional sheet forming processes typically have n values of less than about 30. In contrast, glass materials having few network modifiers, such as silica, typically have n values at or exceeding 30. In addition to the fracture toughness and/or brittleness ratio described above, the substrate of the present invention can optionally have a fatigue value, n, greater than the fatigue value of glasses typically used in display applications, or of at least about 29, for example, about 29, 30, 31, 33, 35, 38, 39, 40, 42, 46, or 50; preferably of at least about 38, for example, about 38, 39, 40, 42, 46, or 50. A fatigue value of at least about 29 is not necessary, but can provide improved physical properties and performance to a substrate. In one aspect, the substrate of the present invention has a fatigue value, n, of 30. In another aspect, the substrate of the present invention has a fatigue value, n, of 39.

Bend Radius

The bend radius of a flexible substrate is the minimum radius to which a substrate can be flexed without fracturing. The allowable bend radius of a flexing substrate is typically inversely proportional to the allowable applied bend stress. Thus, materials with a higher n value can allow a flexible substrate to bend to a smaller radius. A substrate of the present invention can have a bend radius of less than about 30 cm, for example, less than about 30, 28, 26, 24, 22, 20, 18, 16, 14, 12, 10, 8, 6, 4, 2, 1, or 0.5 cm; preferably less than about 10 cm, for example, less than about 10, 8, 6, 4, 2, or 1 cm; or more preferably less than about 2 cm, for example, less than about 2, 1.6, 1.2, 1, 0.8, 0.6, 0.4, or 0.3 cm. A bend radius of less than about 30 cm is not necessary for a substrate of the present invention, but can provide improved flexibility and performance. In one aspect, a substrate has a bend radius of about 26 cm. In another aspect, a substrate has a bend radius of about 8 cm. In yet another aspect, a substrate has a bend radius of about 1.2 cm.

Substrate Composition

The substrate of the present invention comprises at least one amorphous inorganic composition. As used herein, "amorphous" refers to non-crystalline materials in which there is no long-range order. The amorphous inorganic composition can be any inorganic composition suitable for use in the intended application, such as, for example, an electronic device, provided that the substrate has at least one of a brittleness ratio or a fracture toughness as described above. The amorphous inorganic composition can comprise a glass, a glass-ceramic, or a combination thereof. Exemplary glass materials can comprise a boro-silicate glass, a soda-lime glass, a phosphate glass, an alumino-borosilicate glass, a zinc borosilicate glass, a silica glass, a barium borosilicate glass, an aluminosilicate glass, an alkaline earth aluminosilicate glass, a rare earth aluminosilicate glass, or a combination thereof. In one aspect, the substrate comprises a glass. In a specific aspect, the substrate comprises an alumino-borosilicate glass.

The substrate can optionally comprise other compositions. It is not necessary that the entire substrate be an amorphous inorganic composition or that any optional compositions, if present, comprise an amorphous inorganic composition. Such optional compositions, if present, can include crystalline materials. In one aspect, the substrate comprises a glass and a crystalline component. Substrate materials and compositions, such as, for example, glass materials, for use in preparing substrates are commercially available and one of skill in the art could readily select an appropriate material and/or composition based on the criteria recited herein.

Substrate Coating

The substrate of the present invention can optionally comprise a coating on at least a portion of at least one substrate surface. A coating can protect the substrate surface, impart mechanical support to the substrate, and/or provide other properties to the substrate. A coating, if present, can comprise any material and be present at any thickness suitable for use in an electronic device. A coating can be present as a single layer or as multiple, for example, 2, 3, 4, 5, or more layers. Multiple layers, if present, can comprise either the same or different compositions. It is not necessary that all layers comprise the same composition. In one aspect, a substrate comprises a single layer coating on one substrate surface. In another aspect, a substrate comprises a single layer coating on two opposing substrate surfaces. In various exemplary aspects, a coating material comprises polyethylene naphthalate, polyethersulfone, polycarbonate, polyester, polyethylene, polyarylate, polyolefin, cyclic olefin copolymer, polyarylamine, polyamide, polyimide, or a combination thereof. In one aspect, the substrate comprises a polyarylate coating. In another aspect, the substrate comprises a polyethersulfone coating. A coating, if present, can be any thickness suitable for the intended application. The optional coating can be from less than about 1 μm to about 200 μm, or more, for example, about 0.3, 1, 2, 4, 7, 10, 14, 20, 30, 50, 70, 100, 120, 140, 160, 190, 200, or 220 μm. In one aspect, the substrate comprises a coating having a thickness of 1 μm. In another aspect, the substrate comprises a coating having a thickness of 30 μm. In yet another aspect, the substrate comprises a coating having a thickness of 150 μm. In a further aspect, a substrate comprises a two layer coating on two opposing surfaces of the substrate. Coatings and coating materials are commercially available and one of skill in the art could readily select and apply an appropriate coating to a substrate based on the method of device fabrication and/or the intended application.

Electronic Device

The substrate of the present invention can be utilized in a variety of electronic devices, such as, for example, a light emitting display device. The design of a device can vary depending on the intended application and requirements. A device can be flexible or can necessitate that at least a portion of a substrate be flexible. In one aspect, the electronic device is a light emitting device, such as, for example, an organic light emitting display device. In another aspect, the device has a flexible substrate capable of a bend radius of less than about 30 cm.

Devices requiring mechanically durable and flexible substrates can include applications having size and/or weight limitations, such as, for example, cell phones and laptop computers. In such applications, the substrate may remain flat during both the device manufacturing process and in the final application. Such designs can require that a substrate be capable of withstanding bending stresses, but this requirement is not present in all applications. While a substrate of the present invention can be capable of a bend radius of less than about 30 cm, the mechanical durability properties provide additional benefit and value because the substrate can be thinner and lighter weight than conventional substrate materials.

Other applications of mechanically durable substrates include devices where the substrate can undergo a bend radius either during device fabrication or during final application. Examples of such devices include both electronic and display applications such as solar cells, photovoltaics, organic light emitting diode displays, electrophoretic displays, LCD displays, cholesteric liquid crystal displays, Si TFT electronics, organic TFT electronics, oxide based electronics, and other device technologies. In such devices, a substrate can undergo a bend radius during device fabrication, such as, for example, in a bonding/de-bonding step to a carrier substrate, use of a roll-to-roll fabrication process, use of a sheet fed continuous fabrication process, installation of large area displays or electronics requiring un-rolling of a rolled substrate, use of a spooling or un-spooling process, or other processes involving a bend radius. Exemplary devices requiring a bend radius include scrollable, foldable, hinged, or other devices that can experience variable bend states during the device lifetime. Additional exemplary devices include conformable display or electronic devices, such as, for example, display or electronics for automotive dashboards, airplane cockpits, lighting, architectural devices, sensors, and other devices that can be bent once to a permanent or semi-permanent state during the device lifetime.

Method of Making a Flexible Substrate

The present invention further comprises a method for making a flexible substrate comprising: selecting an inorganic material capable of forming a substrate having a thickness of less than about 250 μm and having at least one of: a) a brittleness ratio of less than about 9.5 $(\mu m)^{-1/2}$, or b) a fracture toughness of at least about 0.75 $MPa \cdot (m)^{1/2}$; and then forming a substrate from at least the selected amorphous inorganic material. The forming process can comprise a sintering process, a consolidation process, a drawing process, a process involving an inorganic melt, a slot draw process, a fusion draw process, an updraw process, an overflow process, a downdraw process, a re-draw process, a blowing process, a float process, a crystallization process, an annealing process, a soot deposition process, a roll forming process, other processes capable of forming a thickness of less than about 250 μm, other processes capable of affecting the intrinsic properties (e.g., fracture toughness, modulus, brittleness ratio, fatigue resistance) of an already formed inorganic sheet or article, or a combination thereof. In one aspect, the forming process comprises a fusion process. In another aspect, the forming process comprises a sintering process. In yet another aspect, the forming process comprises a downdraw process. Various forming processes are known and one of skill in the art could readily select an appropriate forming process for use in manufacturing a substrate composition in accordance with the present invention.

The various approaches described herein can be used individually, or in any combination, to form a flexible substrate or an electronic device comprising a flexible substrate. In various aspects, a substrate has a brittleness ratio less than about 9.5 $(\mu m)^{-1/2}$, a fracture toughness of at least about 0.75 $MPa \cdot (m)^{1/2}$, a product of modulus and thickness of less than about 2 GPa·cm, the capability of achieving a bend radius of less than about 30 cm without fracture, or a combination thereof.

Although several aspects of the present invention have been illustrated in the accompanying figures and described in the detailed description, it should be understood that the invention is not limited to the aspects disclosed, but is capable of numerous rearrangements, modifications and substitutions without departing from the spirit of the invention as set forth and defined by the following claims.

EXAMPLES

To further illustrate the principles of the present invention, the following examples are put forth so as to provide those of ordinary skill in the art with a complete disclosure and description of how the articles, devices, and methods claimed herein are made and evaluated. They are intended to be purely exemplary of the invention and are not intended to limit the scope of what the inventors regard as their invention. Efforts have been made to ensure accuracy with respect to numbers (e.g., amounts, temperatures, etc.); however, some errors and deviations should be accounted for. Material properties can exhibit variability depending upon, for example, the particular batch and vendor. Data distributions are thus expected in any measurement method. Unless indicated otherwise, temperature is ° C. or is at ambient temperature, and pressure is at or near atmospheric. There are numerous variations and combinations of process conditions that can be used to optimize product quality and performance. Only reasonable and routine experimentation will be required to optimize such process conditions.

Example 1—Determination of Substrate Properties

In a first example, modulus, hardness, fracture toughness, and brittleness ratios were determined for a variety of materials, including ceramics, glass ceramics, silica glasses, phosphate glasses, and other compositions, as detailed in Table 2, below. Various materials are included to illustrate the physical properties that are suitable for use in substrates in accordance with the present invention, although not all of the materials identified in Table 2 can readily form a glass. Modulus values refer to nano-indentation measurements. Hardness values refer to nano-indentation, Knoop, and/or Vickers measurements, wherein an indentation is made in the substrate by, for example, a pyramidal shaped diamond. Fracture toughness values refer to indentation and/or Chevron notch measurements. Brittleness ratio values refer to measurements of hardness and fracture toughness, as described above. Nano-indentation, Knoop hardness, Vickers hardness, and Chevron notch measurements are known and one of skill in the art could readily select an appropriate test methodology to determine the modulus, hardness, fracture toughness, and/or brittleness ratio of a particular material.

The values in Table 2, include both literature values, where available, and experimentally obtained values. In some cases the general material property values were taken from open literature where the specific measurement technique was not specified. In these cases the values should be assumed to be approximate.

TABLE 2

Properties of Materials

| Material | Modulus GPa | Hardness GPa | Fracture Toughness MPa·(m)$^{1/2}$ | Brittleness Ratio (μm)$^{-1/2}$ | Abraded Strength MPa |
|---|---|---|---|---|---|
| Tungsten Carbide | 680.0 | 16.97 | 8.9 | 1.91 | |
| Aluminum Oxide | 300.0 | 24.09 | 6.54 | 3.68 | 222 |
| Sapphire | 468.0 | 22.54 | 3.45 | 6.53 | 403 |
| Aluminum Nitride | 323.0 | 11.61 | 3.27 | 3.55 | 111 |
| Silicon Nitride | 312.0 | 14.60 | 3.12 | 4.68 | |
| Titanium Dioxide | 270.0 | 11.00 | 2.80 | 3.93 | |
| Corning Macor ® | 66.9 | 2.45 | 1.53 | 1.60 | 102 |
| Corning 7740 | 61.7 | 6.20 | 0.96 | 6.46 | 55 |
| Schott BK-7 | 82.0 | 5.66 | 0.86 | 6.58 | |
| Corning 1737 | 70.4 | 5.59 | 0.78 | 7.16 | 55 |
| Corning HPFS ® | 72.7 | 4.88 | 0.75 | 6.51 | 43 |
| Corning 0211 | 74.4 | 7.70 | 0.71 | 10.85 | |
| Schott D263T | 72.3 | 7.40 | 0.67 | 11.04 | |
| Corning 7070 | 49.2 | 6.50 | 0.64 | 10.09 | 38 |
| Corning 1779 | 87.7 | 4.59 | 0.64 | 7.17 | 44 |
| Schott AF45 | 65.2 | 6.39 | 0.64 | 9.98 | |
| Corning 0215 | 70.0 | 5.68 | 0.63 | 9.02 | 42 |
| Saint-Gobain CS77 | 81.9 | 6.61 | 0.56 | 11.76 | 43 |
| Alkali fluorophosphate glass* | 70.0 | 6.20 | 0.43 | 14.42 | 22 |

*such as an alkali zinc fluorophosphate of the pyrophosphate family

As illustrated in Table 2, a number of conventional glass materials do not possess the fracture toughness or brittleness ratio required by the selection criteria of the present invention. Further, as indicated above, some of the materials detailed in Table 2 that possess either the required fracture toughness and/or brittleness ratio do not readily form glasses and thus, may not be suitable for many applications. Some of the illustrated materials, such as, for example, Corning Macor®, Corning 7740, Schott BK-7, Corning 1737, and Corning HPFS® possess both a fracture toughness of at least about 0.75 MPa·(m)$^{1/2}$ and/or a brittleness ratio of less than about 9.5 (μm)$^{-1/2}$, in accordance with the selection criteria of the present invention. These materials are thus suitable for use as compositions in the thin flexible substrates of the present invention.

Example 2—Abraded Strength

In a second example, abraded strength values were determined for some of the materials described in Example 1. The experimental materials were selected from drastically differing composition families in order to illustrate the relationship between physical properties. Samples of selected materials were cut and polished to approximately 1 inch by 1 inch pieces, approximately 1 mm thick. The samples were subsequently abraded on one side with 150J sandpaper, after which ring-on-ring biaxial strength was tested with the abraded sample side being put in tension. For this strength test, the load ring diameter was typically 0.25 inch and the support ring diameter was typically 0.50 inch. A test speed was typically 0.05 inch per minute.

Figure 2:
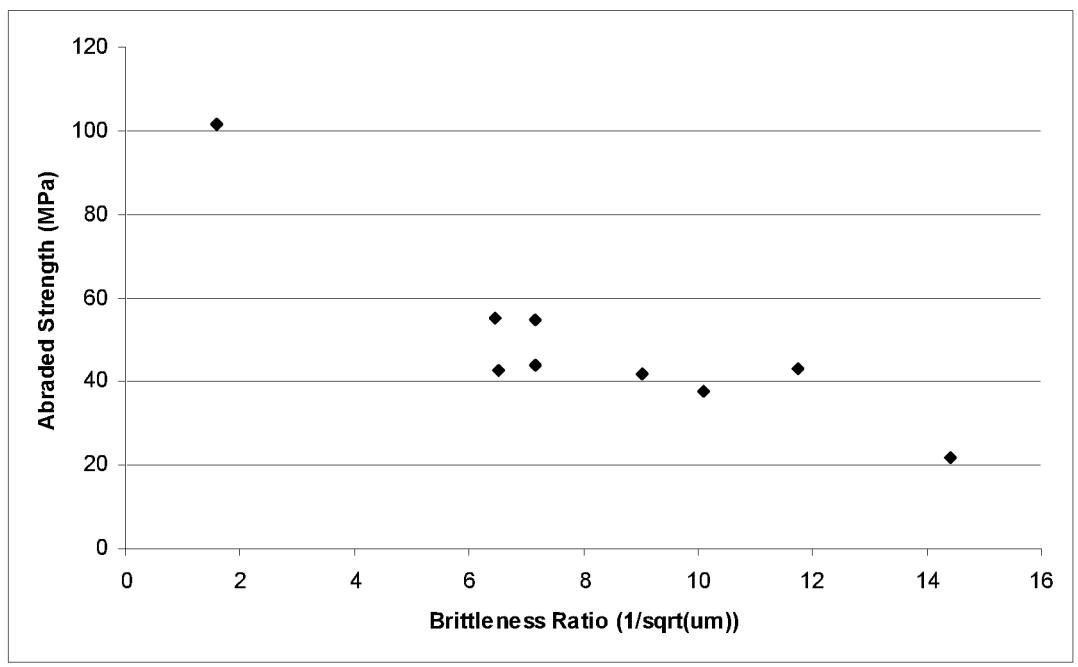
FIG. 2 illustrates the abraded strength of various materials as a function of brittleness ratio, in accordance with various aspects of the present invention.

FIGS. 1-2 illustrate the resulting abraded strength values as a function of fracture toughness and brittleness ratio, respectively. FIG. 1 illustrates a trend of increasing abraded strength with increasing fracture toughness. Similarly, FIG. 2 illustrates the trend of increasing abraded strength with decreasing brittleness ratio. Thus, a substrate having an increased abraded strength can be achieved by either an increase in fracture toughness, a decrease in brittleness ratio, or a combination thereof.

Various modifications and variations can be made to the compositions, articles, devices, and methods described herein. Other aspects of the compositions, articles, devices, and methods described herein will be apparent from consideration of the specification and practice of the compositions, articles, devices, and methods disclosed herein. It is intended that the specification and examples be considered as exemplary.

What is claimed is:

1. A substrate comprising an amorphous inorganic composition free of Li, Na, K, Rb, Cs, and Fr, wherein the substrate has a thickness of from about 1 μm to less than about 250 μm and at least one of:
   a) a brittleness ratio of less than about 9.5 (μm)$^{-1/2}$, or
   b) a fracture toughness of at least about 0.75 MPa·(m)$^{1/2}$;
   wherein the substrate has a bend radius of less than about 30 cm; and
   wherein the substrate further comprises at least one coating layer on at least a portion of at least one surface of the substrate, wherein the coating layer is selected from the group consisting of a polyethylene naphthalate, a polyethersulfone, a polycarbonate, a polyester, a polyethylene, a polyarylate, a polyolefin, a cyclic olefin copolymer, a polyarylamine, a polyamide, a polyimide and combinations thereof.

2. The substrate of claim 1, wherein the coating has a thickness of from less than about 1 μm to about 200 μm.

3. The substrate of claim 2, wherein the coating has a thickness of about 1 μm.

4. The substrate of claim 1, wherein the substrate comprises a two layer coating on two opposing surfaces of the substrate.

5. The substrate of claim 1, wherein the substrate has a modulus, and wherein the product of the substrate modulus and the substrate thickness is less than about 2.0 GPa·cm.

6. The substrate of claim 5, wherein the product of the substrate modulus and the substrate thickness is less than about 1.0 GPa·cm.

7. The substrate of claim 1, wherein the substrate has both a brittleness ratio of less than about 9.5 $(\mu m)^{-1/2}$ and a fracture toughness of at least about 0.75 MPa·$(m)^{1/2}$.

8. The substrate of claim 1, wherein the substrate has both a brittleness ratio of less than about 9.5 $(\mu m)^{-1/2}$ and a fracture toughness of at least about 0.75 MPa·$(m)^{1/2}$; wherein the substrate has a modulus, and wherein the product of the substrate modulus and the substrate thickness is less than about 2.0 GPa·cm.

9. The substrate of claim 1, wherein the substrate has both a brittleness ratio of less than about 8.0 $(\mu m)^{1/2}$ and a fracture toughness of at least about 0.9 MPa·$(m)^{1/2}$; wherein the substrate has a modulus, and wherein the product of the substrate modulus and the substrate thickness is less than about 2.0 GPa·cm.

10. The substrate of claim 1, wherein the substrate has a fatigue value, n, greater than about 29.

11. The substrate of claim 1, wherein the substrate has a fatigue value, n, greater than about 38.

12. The substrate of claim 1, wherein the composition comprises a glass, a glass-ceramic, or a combination thereof.

13. The substrate of claim 1, wherein the substrate has a bend radius of less than about 2 cm.

14. The substrate of claim 1, wherein the substrate is fusion-drawn.

15. The substrate of claim 1, wherein the substrate is a borosilicate glass.

16. The substrate of claim 15, wherein the borosilicate glass is a an alumina-borosilicate glass.

17. An electronic device comprising an amorphous inorganic composition free of Li Na, K, Rb, Cs, and Fr, wherein the substrate has a thickness of from about 1 µm to less than about 250 µm and at least one of:
   a) a brittleness ratio of less than about 9.5 $(\mu m)^{-1/2}$, or
   b) a fracture toughness of at least about 0.75 MPa·$(m)^{1/2}$;
   wherein the substrate has a bend radius of less than about 30 cm; and
   wherein the substrate further comprises at least one coating layer on at least a portion of at least one surface of the substrate, wherein the coating layer is selected from the group consisting of a polyethylene naphthalate, a polyethersulfone, a polycarbonate, a polyester, a polyethylene, a polyarylate, a polyolefin, a cyclic olefin copolymer, a polyarylamine, a polyamide, a polyimide and combinations thereof.

18. The electronic device of claim 17, wherein the substrate has a modulus, and wherein the product of the substrate modulus and the substrate thickness is less than about 2.0 GPa·cm.

19. The electronic device of claim 17, wherein the electronic device comprises a light emitting display.

20. The electronic device of claim 17, wherein the electronic device comprises an organic light emitting display device.

* * * * *

UNITED STATES PATENT AND TRADEMARK OFFICE
CERTIFICATE OF CORRECTION

PATENT NO. : 10,636,988 B2
APPLICATION NO. : 16/405224
DATED : April 28, 2020
INVENTOR(S) : Sean Matthew Garner et al.

Page 1 of 1

It is certified that error appears in the above-identified patent and that said Letters Patent is hereby corrected as shown below:

On the Title Page

On page 2, in Column 2, item (56), Other Publications, Line 27, delete "(1998." and insert -- (1998). --, therefor.

In the Claims

In Column 14, Line 6, Claim 16, delete "a an" and insert -- an --, therefor.

In Column 14, Line 7, Claim 17, delete "comprising" and insert -- comprising a flexible substrate comprising --, therefor.

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*